(12) United States Patent
Kawasaki

(10) Patent No.: US 9,237,054 B2
(45) Date of Patent: Jan. 12, 2016

(54) DISTORTION COMPENSATION DEVICE AND DISTORTION COMPENSATION DEVICE METHOD

(71) Applicant: FUJITSU LIMITED, Kawasaki-shi, Kanagawa (JP)

(72) Inventor: Toshio Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/165,315

(22) Filed: Jan. 27, 2014

(65) Prior Publication Data

US 2014/0286454 A1    Sep. 25, 2014

(30) Foreign Application Priority Data

Mar. 19, 2013   (JP) .................................. 2013-057359

(51) Int. Cl.
  *H04L 27/36*    (2006.01)
  *H03F 1/32*    (2006.01)
(52) U.S. Cl.
  CPC ............ *H04L 27/367* (2013.01); *H03F 1/3247* (2013.01)
(58) Field of Classification Search
  CPC .......... H03F 1/3247; H03F 2201/3233; H04L 25/03343; H04L 27/368; H04B 1/0475; H04B 2001/0425
  USPC ....................................................... 375/297
  See application file for complete search history.

(56) References Cited

U.S. PATENT DOCUMENTS

| | | | |
|---|---|---|---|
| 8,150,335 B2 * | 4/2012 | Waheed et al. ............ 455/114.3 |
| 2003/0207680 A1 * | 11/2003 | Yang ..................... H03F 1/3247 |
| | | | 455/341 |
| 2009/0310705 A1 | 12/2009 | Fujimoto |
| 2010/0035554 A1 * | 2/2010 | Ba et al. ....................... 455/63.1 |
| 2012/0275545 A1 * | 11/2012 | Utsunomiya et al. ......... 375/297 |
| 2012/0299644 A1 * | 11/2012 | Koren et al. ............... 330/124 R |
| 2013/0223565 A1 * | 8/2013 | McCallister .................. 375/297 |

FOREIGN PATENT DOCUMENTS

| | | |
|---|---|---|
| JP | 2000-278190 A | 10/2000 |
| JP | 2003-347944 A | 12/2003 |
| JP | 2005-033535 A | 2/2005 |
| JP | WO 2008/111471 A1 | 9/2008 |
| JP | 2008-258714 A | 10/2008 |

* cited by examiner

*Primary Examiner* — Shuwang Liu
*Assistant Examiner* — David S Huang
(74) *Attorney, Agent, or Firm* — Arent Fox LLP

(57) ABSTRACT

A distortion compensation device includes: a memory configured to store a first and second table, different addresses being assigned to the first and second table respectively, each of the addresses being related to a distortion compensation coefficient to compensate for a non-linear distortion, a first address in the first table and a second address in the second table corresponding to respective first and second ranges of power or amplitude of a transmission signal, and parts of the first and second ranges overlapping each other; and a processor coupled to the memory and configured to: update the respective distortion compensation coefficients related to the first address and the second address simultaneously, in accordance with a single value of the power or the amplitude, and compensate for the non-linear distortion generated by an amplifier amplifying the power of the transmission signal, by using at least one of the first and second table.

8 Claims, 11 Drawing Sheets

DISTORTION COMPENSATION DEVICE AND DISTORTION COMPENSATION DEVICE METHOD

CROSS-REFERENCE TO RELATED APPLICATION

This application is based upon and claims the benefit of priority of the prior Japanese Patent Application No. 2013-057359, filed on Mar. 19, 2013, the entire contents of which are incorporated herein by reference.

FIELD

The embodiments discussed herein are related to a distortion compensation device and a distortion compensation method.

BACKGROUND

With the increasing speed of radio communication, the bandwidth and dynamic range of transmission signals have been recently increased. Under such circumstances, a high linearity is in demand for amplifiers that amplify transmission signals, in order to minimize the deterioration of signal quality. In addition, high power-conversion efficiency is also in demand for amplifiers, in terms of power consumption.

SUMMARY

According to an aspect of the invention, a distortion compensation device includes: a memory configured to store a first table and a second table, different addresses being assigned to the first table and the second table respectively, each of the addresses being related to a distortion compensation coefficient to compensate for a non-linear distortion, a first address in the first table and a second address in the second table corresponding to respective first and second ranges of power or amplitude of a transmission signal, and parts of the first and second ranges overlapping each other; and a processor coupled to the memory and configured to: update the respective distortion compensation coefficients related to the first address and the second address simultaneously, in accordance with a single value of the power or the amplitude, and compensate for the non-linear distortion generated by an amplifier amplifying the power of the transmission signal, by using at least one of the first table and the second table.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
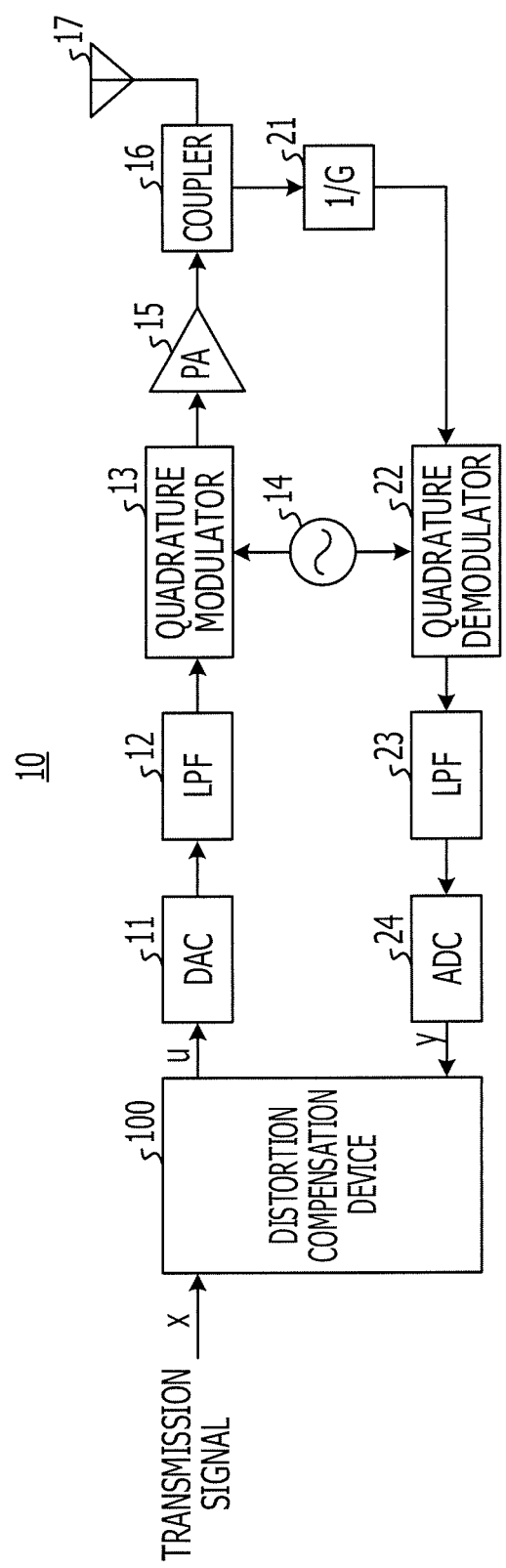
FIG. 1 is a block diagram illustrating an exemplary configuration of a radio transmission device in a first embodiment.

Hereinafter, a detailed description will be given of a distortion compensation device and method in first to fourth embodiments, with reference to the accompanying drawings. Note that the embodiments are not intended to limit the distortion compensation device and method. In the following embodiments, constituent elements that have the same functions are denoted by the same reference characters and will not be described.

While inventing the present embodiments, observations were made regarding a related art. Such observations include the following, for example.

In amplifiers of the related art, there is a trade-off between linearity and power-conversion efficiency. For example, when an amplifier operates in a linear region by backing off its output power from the saturation, the out-of-band distortions generated by the amplifier are reduced, but its power-conversion efficiency decreases and the power consumption therefore increases. In order to achieve both high linearity and high power-conversion efficiency, distortion compensation devices have been used. Typically, a distortion compensation device compensates for the generated non-linear distortions when an amplifier operates in a non-linear region. As a result, it is possible for an amplifier to operate with increased power-conversion efficiency while maintaining its linearity.

Such distortion compensation devices employ a predistortion (also referred to as a "PD" hereinafter) technique, which is a distortion compensation method. In this technique, a distortion compensation coefficient that inversely models the non-linearity of an amplifier is prepared, and the transmission signal is multiplied by this coefficient, so that the output linearity of an amplifier is increased. One exemplary distortion compensation device of a PD type has a distortion compensation table that stores multiple distortion compensation coefficients. Then, the distortion compensation device designates an address related to the power of a transmission signal, or the input power of the amplifier, to the distortion compensation table, and reads a corresponding distortion compensation coefficient therefrom. Further, the distortion compensation coefficients in the distortion compensation table are successively updated in such a way that a difference between the input signal and the output signal is minimized.

In general, there is a low probability that power in a low-power region (substantially zero) or the non-linear (high-power) region is input to an amplifier. Therefore, the occurrence frequency at which an address is generated in response to such low or high input power decreases. Thus, distortion compensation coefficients related to addresses having a low occurrence frequency are updated at a low frequency. As a result, it takes a long time to suitably converge the distortion compensation coefficients in the distortion compensation table which correspond to the addresses having a low occurrence frequency.

In consideration of the above disadvantage, Japanese Laid-open Patent Publication No. 2003-347944 discusses a technique for measuring the occurrence frequencies of addresses and making an address conversion in such a way that the occurrence frequencies are nearly equalized.

In the above technique, there arises a case where multiple addresses are allocated to the same distortion compensation coefficient related to the input power in the high power region. In this case, the transmission signals in the high power region may be all compensated by using the same distortion compensation coefficient. As a result, the distortion compensation property for the transmission signal in the high power region may deteriorate.

Therefore, the embodiments discussed herein address the above situations with an object of providing a distortion compensation device and method that are capable of compensating for distortions appropriately and converging distortion compensation coefficients at an early stage.

[First Embodiment]

(Exemplary Configuration of Radio Transmission Device)

FIG. 1 is a block diagram illustrating an exemplary configuration of a radio transmission device in a first embodiment. Referring to FIG. 1, a radio transmission device 10 has a distortion compensation device 100, a digital to analog converter (DAC) 11, and a low-pass filter (LPF) 12. In addition, the radio transmission device 10 has a quadrature modulator 13, a local signal generator 14, a power amplifier (PA) 15, a coupler 16, and an antenna 17. Furthermore, the radio transmission device 10 has a divider (1/G) 21, a quadrature demodulator 22, an LPF 23, and an analog to digital converter (ADC) 24. The distortion compensation device 100 is provided in the radio transmission device 10, together with the PA 15.

The distortion compensation device 100 compensates for the non-linearity of the PA 15. In more detail, the distortion compensation device 100 subjects a baseband signal, or a transmission signal x, to PD distortion compensation by using a feedback signal y to be input to the distortion compensation device 100, and outputs a signal u acquired as a result of the distortion compensation to the DAC 11. Details of the distortion compensation device 100 will be described below.

The DAC 11 converts the digital baseband signal into an analog baseband signal, and outputs this analog baseband signal to the LPF 12.

The LPF 12 removes high-frequency components from the baseband signal, and outputs the baseband signal containing only low-frequency components to the quadrature modulator 13.

The local signal generator 14 generates a local signal of a predetermined frequency, and outputs this local signal to both the quadrature modulator 13 and the quadrature demodulator 22.

The quadrature modulator 13 multiplies an I signal in the baseband signal by the local signal, and a Q signal in the baseband signal by the local signal, the phase of which is shifted by $\pi/2$. The quadrature modulator 13 then performs a quadrature modulation by adding the multiplied results together, and outputs a modulated signal to the PA 15.

The PA 15 amplifies the power of the modulated signal, and outputs the signal having the amplified power to the coupler 16.

The coupler 16 branches the signal having the amplified power into respective signals to the antenna 17 and the divider 21. The signal output from the PA 15 is then fed back to the distortion compensation device 100.

The antenna 17 transmits the signal having the amplified power.

The divider 21 divides the signal having the amplified power by the linear gain G of the PA 15, and outputs the divided signal to the quadrature demodulator 22. As long as the PA 15 operates in the linear region, the signal divided by the divider 21 ideally becomes the same as the signal that enters the PA 15.

The quadrature demodulator 22 performs a quadrature demodulation by multiplying the signal received from the divider 21 by the local signal, the phase of which is shifted from that of the received signal by $\pi/2$. The quadrature demodulator 22 then outputs a baseband signal containing I and Q signals acquired as a result of the quadrature demodulation to the LPF 23.

The LPF 23 removes high-frequency components from the baseband signal, and outputs the baseband signal containing only low-frequency components to the ADC 24.

The ADC 24 converts the analog baseband signal into a digital baseband signal, and outputs this digital baseband signal to the distortion compensation device 100 as the feedback signal y.

(Exemplary Configuration of Distortion Compensation Device)

Figure 2:
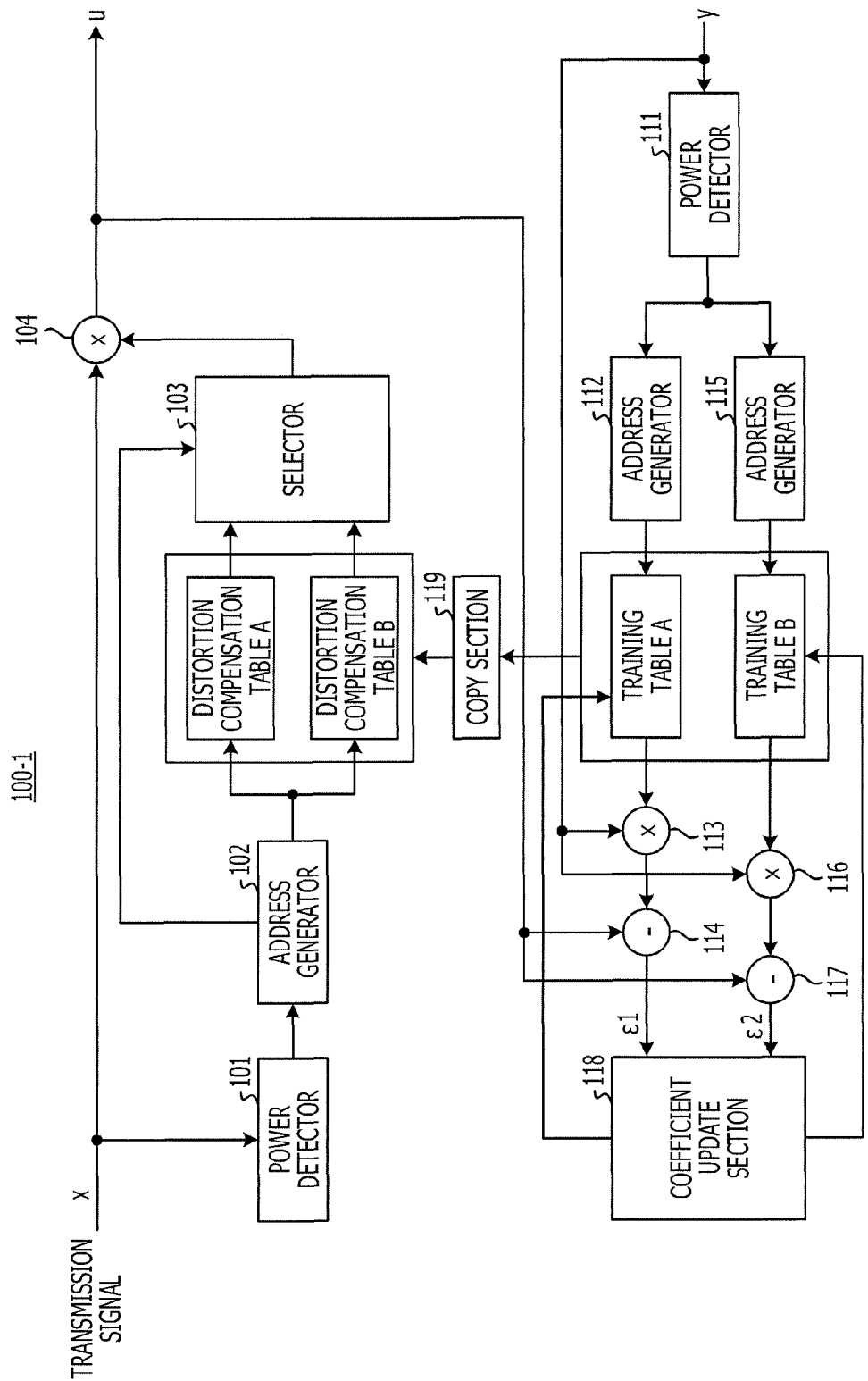
FIG. 2 is a block diagram illustrating an exemplary configuration of the distortion compensation device in the first embodiment.

FIG. 2 is a block diagram illustrating an exemplary configuration of the distortion compensation device in the first embodiment. A distortion compensation device 100-1 in FIG. 2 corresponds to the distortion compensation device 100 in FIG. 1. The distortion compensation device 100-1 employs an indirect-learning scheme. Referring to FIG. 2, the distortion compensation device 100-1 has a power detector 101, an address generator 102, distortion compensation tables A and B, a selector 103, and a multiplier 104. Furthermore, the distortion compensation device 100-1 has a power detector 111, address generators 112 and 115, training tables A and B, multipliers 113 and 116, subtractors 114 and 117, a coefficient update section 118, and a copy section 119.

The power detector 101 detects the power of the transmission signal x, and outputs a signal indicating the detected power to the address generator 102.

The address generator 102 generates addresses in accordance with the power detected by the power detector 101. The address generator 102 then passes the generated addresses to the distortion compensation tables A and B, respectively, reads respective distortion compensation coefficients related to these addresses from the distortion compensation tables A and B, and outputs the distortion compensation coefficients to the selector 103. In addition, the address generator 102 outputs the generated addresses to the selector 103. Details of the method of generating an address will be described below.

The distortion compensation tables A and B each store multiple addresses and distortion compensation coefficients related to these addresses. In this case, different addresses are assigned to the distortion compensation tables A and B, respectively, in relation to the same power. The contents of the distortion compensation tables A and B are copies of those of the training tables A and B, respectively. Details of the distortion compensation tables A and B will be described below.

The selector 103 selects one of the distortion compensation tables A and B which is used to compensate for distortions, in accordance with the addresses received from the address generator 102. In more detail, the selector 103 selects one of the distortion compensation coefficients output from the distortion compensation tables A and B, in accordance with the addresses received from the address generator 102. The selector 103 then outputs the selected distortion compensation coefficient to the multiplier 104.

The multiplier 104 compensates for the distortions in the transmission signal x by multiplying the transmission signal x by the distortion compensation coefficient. Then, the multiplier 104 outputs the distortion-compensated signal, or the signal u, to the DAC 11 (see FIG. 1) and the subtractors 114 and 117.

The power detector 111 and the multipliers 113 and 116 receive the signal y from the ADC 24 (see FIG. 1).

The power detector 111 detects the power of the signal y, and outputs a signal indicating the detected power to both the address generators 112 and 115.

The address generator 112 generates an address in accordance with the power detected by the power detector 111. The address generator 112 then passes the generated address to the training table A, reads a distortion compensation coefficient related to this address from the training table A, and outputs this distortion compensation coefficient to the multiplier 113. The address passed to the training table A becomes an address to be read from and written to the training table A. Likewise, the address generator 115 generates an address in accordance with the power detected by the power detector 111. The address generator 115 then passes the generated address to the training table B, reads a distortion compensation coefficient related to this address, and outputs this distortion compensation coefficient to the multiplier 116. The address passed to the training table B becomes an address to be read from and written to the training table B. The address generator 112 and the address generator 115 generate different addresses in relation to the same power. Details of the method of generating addresses will be described below.

The training tables A and B each store multiple addresses and distortion compensation coefficients related to these addresses. In this case, different addresses are assigned to the training tables A and B, respectively, in relation to the same power, similar to the distortion compensation tables A and B. Details of the training tables A and B will be described below.

The multiplier 113 multiplies the signal y by the distortion compensation coefficient received from the training table A, and outputs this signal to the subtractor 114. The subtractor 114 determines a difference $\epsilon1$ between the received signal and the signal u, and outputs the difference $\epsilon1$ to the coefficient update section 118.

The multiplier 116 multiplies the signal y by the distortion compensation coefficient received from the training table B, and outputs this signal to the subtractor 117. The subtractor 117 determines a difference $\epsilon2$ between the received signal and the signal u, and outputs the difference $\epsilon2$ to the coefficient update section 118.

The coefficient update section 118 updates a distortion compensation coefficient related to the address written to the training table A, for example, by using a least mean squares (LMS) algorithm, in such a way that the difference $\epsilon1$ is minimized. Likewise, the coefficient update section 118 updates a distortion compensation coefficient related to the address written to the training table B, for example, by using the LMS algorithm, in such a way that the difference $\epsilon2$ is minimized.

The distortion compensation device 100-1 successively performs the above process, every time a transmission signal x is received.

At fixed intervals, or every time the contents of both the training tables A and B are updated preset multiple times, the copy section 119 copies the contents of the training tables A and B to the distortion compensation table A and B, respectively.

(Processing Operation of Distortion Compensation Device)

Figure 3:
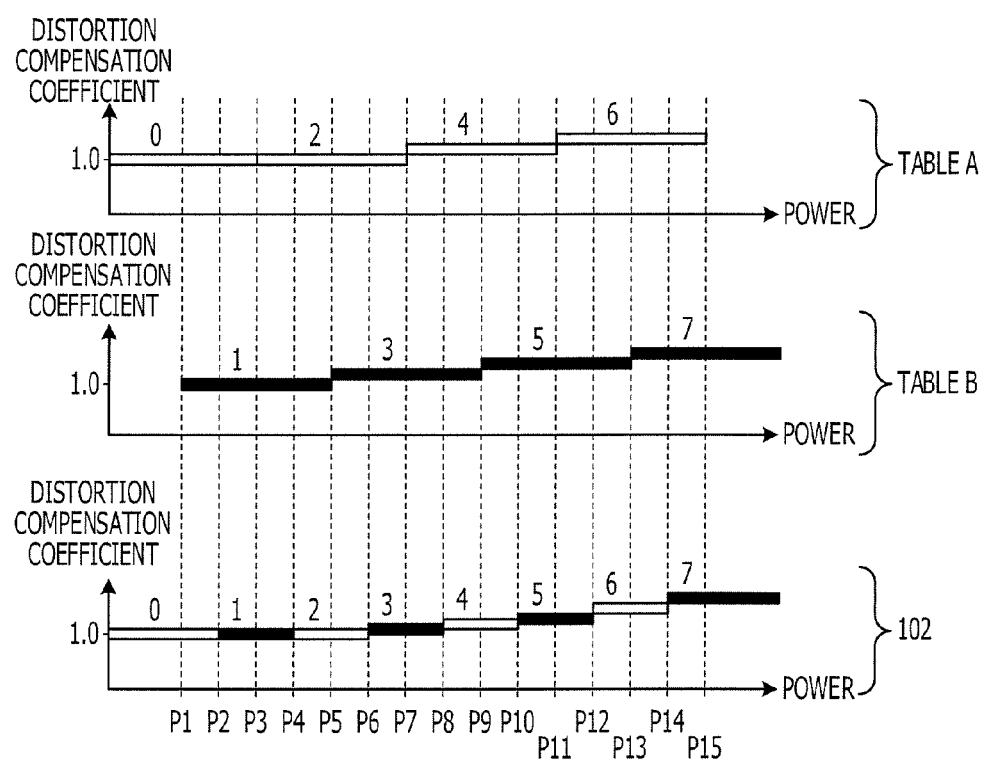
FIG. 3 illustrates a processing operation of the distortion compensation device in the first embodiment.
Figure 4:
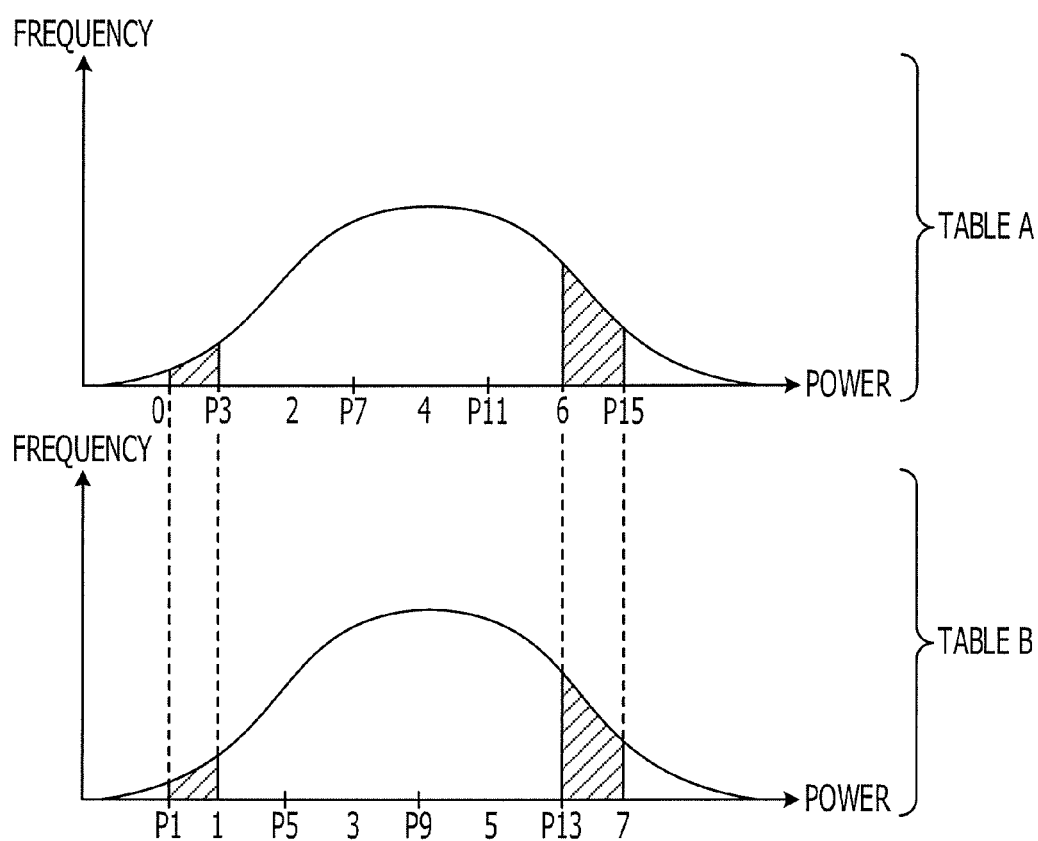
FIG. 4 illustrates the processing operation of the distortion compensation device in the first embodiment.

FIGS. 3 and 4 illustrate a processing operation of the distortion compensation device in the first embodiment. As a result of the copying operation of the copy section 119, the distortion compensation table A and the training table A have the same content, and the distortion compensation table B and the training table B have the same content. In FIGS. 3 and 4, both the distortion compensation table A and the training table A are represented collectively by a "table A," and both the distortion compensation table B and the training table B are represented collectively by a "table B." In FIGS. 3 and 4, characters P1 to P15 denote the power of a transmission signal x or a signal y, and numbers 0 to 7 denote addresses in a corresponding table.

(Processing Operations with Training Tables a and B)

Processing operations with the training tables A and B will first be described.

In the training table A, addresses 0, 2, 4 and 6 cover power ranges: of lower than P3; from P3 to lower than P7; from P7 to lower than P11; and from P11 to lower than P15, respectively, as illustrated in FIG. 3. The address generator 112 thus generates the addresses 0, 2, 4 and 6 when the power of the signal y falls within the power ranges: of lower than P3; from P3 to lower than P7; from P7 to lower than P11; and from P11 to lower than P15, respectively.

In the training table B, addresses 1, 3, 5 and 7 cover power ranges: from P1 to lower than P5; from P5 to lower than P9; from P9 to lower than P13; and of P13 or larger, respectively. The address generator 115 thus generates addresses 1, 3, 5 and 7 when the power of the signal y falls within the power ranges: from P1 to lower than P5; from P5 to lower than P9; from P9 to lower than P13; and of P13 or larger, respectively.

The power range of P1 to P5 that the address 1 in the training table B covers overlaps both the power range of P1 to P3, which is part of a power range that the address 0 in the training table A covers, and the power range of P3 to P5, which is part of a power range that the address 2 in the training table A covers. Likewise, the power range of P5 to P9 that the address 3 in the training table B covers overlaps both the power range of P5 to P7, which is part of a power range that the address 2 in the training table A covers, and the power range of P7 to P9, which is part of a power range that the address 4 in the training table A covers. This also applies to the addresses 4 to 7. Thus, the addresses assigned to the training table A differ from the addresses assigned to the training table B, and a power range that one of the addresses in the table A covers overlaps at least one of the power ranges that the addresses in the table B covers.

To give an example, in the case where the power of the signal y falls within the range of P1 to P3, a distortion compensation coefficient related to the address 0 in the training table A is updated. Simultaneously, a distortion compensation coefficient corresponding to the address 1 in the training table B is also updated. To give another example, in the case where the power of the signal y falls within the range of P13 to P15, a distortion compensation coefficient related to the address 6 in the training table A is updated. Simultaneously, a distortion compensation coefficient related to the address 7 in the training table B is also updated. Therefore, since a power range that one of the addresses in the table A covers overlaps a power range that at least one of the addresses in the table B covers, distortion compensation coefficients in both the tables A and B are updated at an increased frequency. This scheme is illustrated in FIG. 4. In this manner, the distortion compensation device 100-1 updates distortion compensation coefficients in both the training tables A and B simultaneously, in relation to the power of the single signal y. According to this embodiment, the distortion compensation device 100 (100-1) is capable of converging distortion compensation coefficients at an early stage by updating them at an increased frequency.

(Processing Operation with Distortion Compensation Tables A and B)

A description will be given of a processing operation with the distortion compensation tables A and B.

As illustrated in FIG. 3, the address generator 102 generates addresses 0, 1, 2 and 3 when the power of a transmission signal x falls within ranges: of lower than P2; from P2 to lower than P4; and from P4 to lower than P6, and from P6 to lower than P8, respectively. In addition, the address generator 102 generates addresses 4, 5, 6 and 7 when the power of the transmission signal x falls within ranges: from P8 to lower than P10; from P10 to lower than P12; from P12 to lower than P14; and of P14 or larger, respectively. The address generator 102 accordingly generates an address, the coverage power range of which is narrower than a power range that an address in each of the distortion compensation tables A and B covers. To give an example, the address 1 in the distortion compensation table B covers the power range of P1 to P5, whereas the address 1 generated by the address generator 102 covers the power range of P2 to P4, which corresponds to only the central part of the power range of P1 to P5. To give another example, the address 2 in the distortion compensation table A covers the power range of P3 to P7, whereas the address 2 generated by the address generator 102 covers the power range of P4 to P6, which corresponds to only the central part of the power range of P3 to P7.

As described above, the contents of the distortion compensation tables A and B are copies of those of the training tables A and B, respectively. If the address generator 102 generates one of the addresses 0, 2, 4 and 6, a distortion compensation coefficient related to the generated address is extracted from the distortion compensation table A. If the address generator 102 generates one of the addresses 1, 3, 5 and 7, a distortion compensation coefficient related to the generated address is extracted from the distortion compensation table B. In response, if receiving one of the addresses 0, 2, 4 and 6 from the address generator 102, the selector 103 selects the distortion compensation table A. Otherwise, if receiving one of the addresses 1, 3, 5 and 7 from the address generator 102, the selector 103 selects the distortion compensation table B. The distortion compensation device 100-1 then switches between the distortion compensation tables A and B, depending on the power of a transmission signal x, or an address, thereby selecting a table suitable for compensating for the distortions of the transmission signal x. The contents of the training tables A and B are simultaneously and independently copied to the distortion compensation tables A and B in accordance with the differences $\epsilon 1$ and $\epsilon 2$, respectively. This enables the distortion compensation tables A and B to store precise distortion compensation coefficients. Consequently, this embodiment enables the distortion compensation property to be maintained appropriately.

According to the first embodiment, it is possible for the distortion compensation device 100-1 to compensate for distortions appropriately and to converge distortion compensation coefficients at an early stage.

[Second Embodiment]

A second embodiment differs from the first embodiment in weighting differences $\epsilon 1$ and $\epsilon 2$.

(Exemplary Configuration of Distortion Compensation Device)

Figure 5:
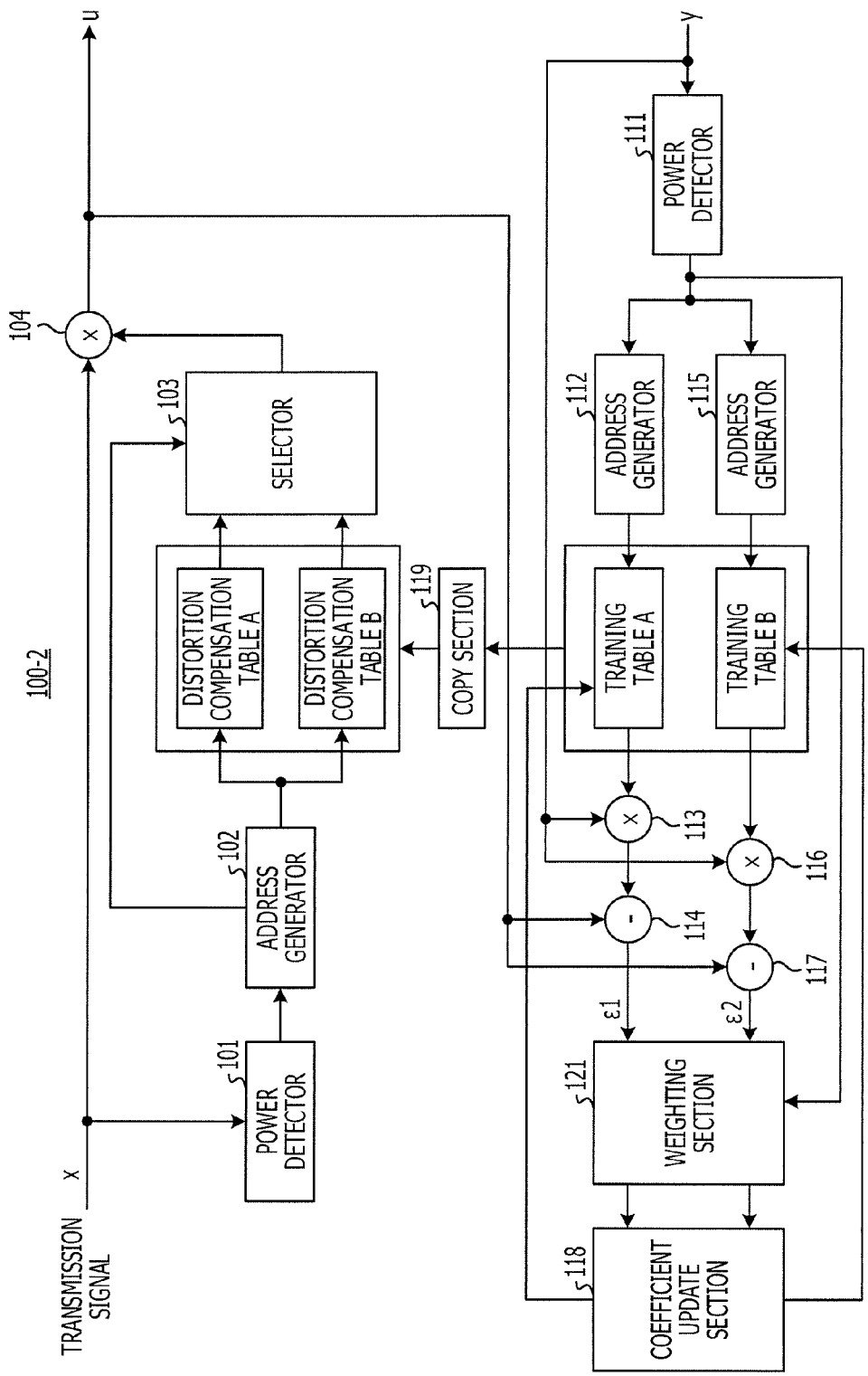
FIG. 5 is a block diagram illustrating an exemplary configuration of a radio transmission device in a second embodiment.

FIG. 5 is a block diagram illustrating an exemplary configuration of a distortion compensation device in the second embodiment. The distortion compensation device 100-2 in FIG. 5 corresponds to the distortion compensation device 100 in FIG. 1. The distortion compensation device 100-2 has a weighting section 121.

The weighting section 121 receives differences $\epsilon 1$ and $\epsilon 2$ from subtractors 114 and 117, respectively. Furthermore, the weighting section 121 receives a signal indicating the power of a signal y from a power detector 111.

The weighting section 121 weights the differences $\epsilon 1$ and $\epsilon 2$ in accordance with the power of the signal y, and outputs the weighted differences $\epsilon 1$ and $\epsilon 2$ to the coefficient update section 118.

The coefficient update section 118 updates distortion compensation coefficients in the training tables A and B by using the weighted differences $\epsilon 1$ and $\epsilon 2$.

(Processing Operation of Weighting Section)

Figure 6:
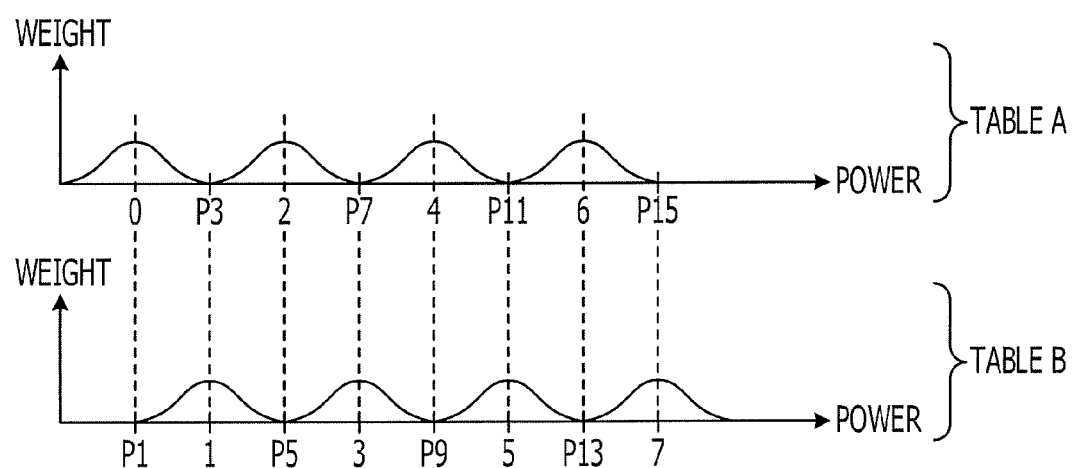
FIG. 6 illustrates a processing operation of the weighting section in the second embodiment.

FIG. 6 illustrates a processing operation of the weighting section in the second embodiment.

As illustrated in FIG. 6, the weighting section 121 weights a difference more heavily, as power from which this difference is derived is closer to the center of any of the power ranges that the respective addresses cover. A reason for this is that the power ranges of addresses that the address generator 102 generates corresponds to the central parts of the corresponding power ranges of the addresses in the tables A and B, as illustrated in FIG. 3. Specifically, although power at the center of the power range related to each address in the distortion compensation table A and B is used to compensate for distortions, power on each side of the power range is not. Therefore, the coefficient update section 118 updates a distortion compensation coefficient by using the difference weighted more heavily when power from which a difference is derived is at the center of the power range than when the power is on each side thereof. The weighting section 121 thus weights the differences $\epsilon 1$ and $\epsilon 2$ that are to be used in the update operation of the coefficient update section 118, in accordance with the power of the signal y.

In the second embodiment, as described above, the differences $\epsilon 1$ and $\epsilon 2$ are weighted in accordance with the power of the signal y. Therefore, the degree to which the differences $\epsilon 1$ and $\epsilon 2$ influence the update of a distortion compensation coefficient differs depending on the power of the signal y. In more detail, since power at the center of each power range is used to compensate for distortions but power on each side of each power range is not, the weighting section 121 weights the difference more heavily when power from which a difference is derived is at the center of the power range than when the power is on each side thereof. Consequently, it is possible to improve the distortion compensation property.

[Third Embodiment]

A third embodiment differs from the first embodiment in determining a distortion compensation table based on the occurrence frequency of each address.

(Exemplary Configuration of Distortion Compensation Device)

Figure 7:
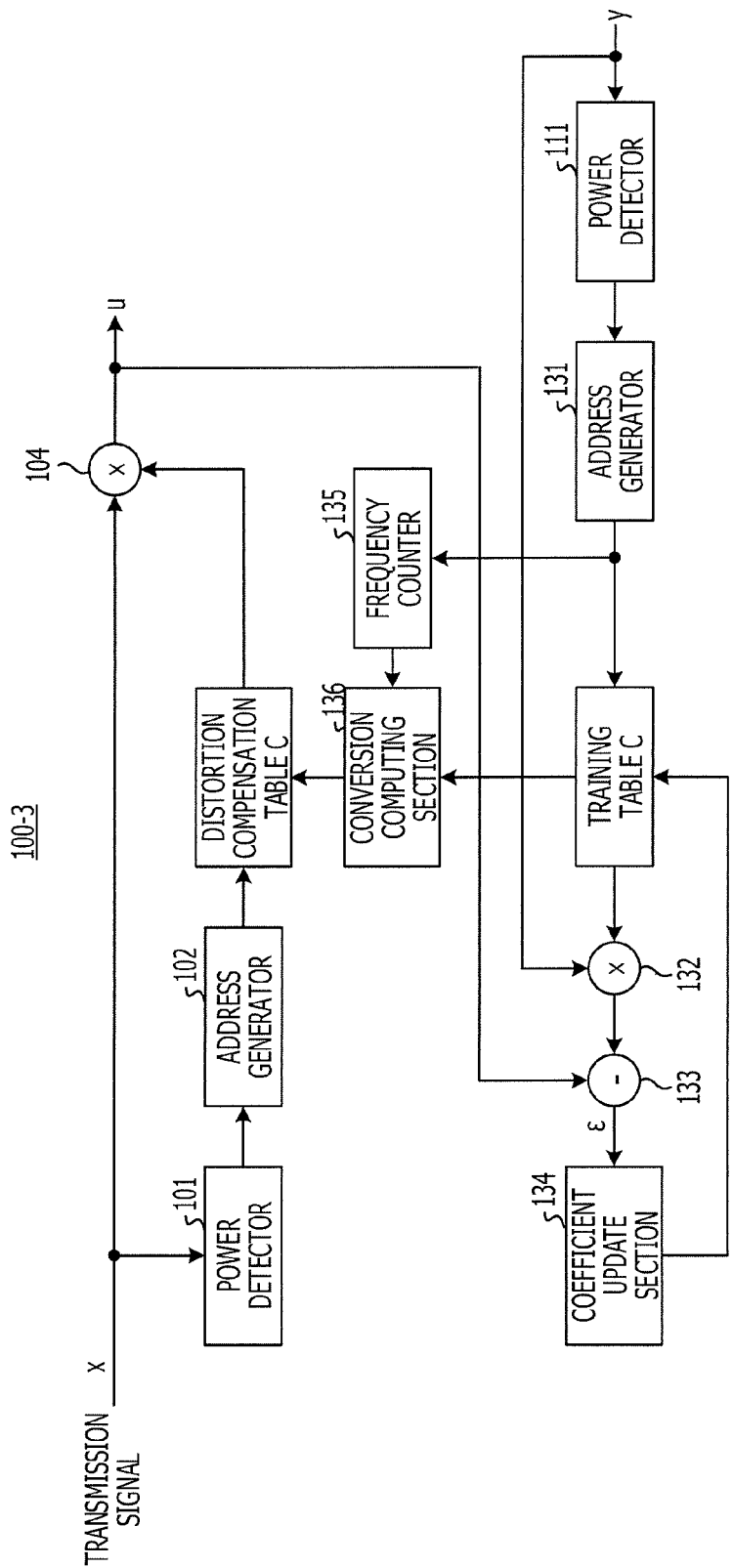
FIG. 7 is a block diagram illustrating an exemplary configuration of a distortion compensation device in a third embodiment.

FIG. 7 is a block diagram illustrating an exemplary configuration of a distortion compensation device in the third embodiment. A distortion compensation device 100-3 in FIG. 7 corresponds to the distortion compensation device 100 in FIG. 1. The distortion compensation device 100-3 in FIG. 7 has an address generator 131, a training table C, a multiplier 132, a subtractor 133, a coefficient update section 134, a frequency counter 135, a conversion computing section 136, and a distortion compensation table C.

The address generator 131 generates an address in accordance with the power detected by the power detector 111. The address generator 131 passes the generated address to the training table C, reads a distortion compensation coefficient related to this address from the training table C, and outputs this distortion compensation coefficient to the multiplier 132. The address passed to the training table C becomes an address read from and written to the training table C. The address generator 131 outputs the generated address to the frequency counter 135.

The training table C stores multiple addresses and distortion compensation coefficients related to the addresses.

The multiplier 132 multiplies the signal y by a distortion compensation coefficient receiving from the training table C, and outputs the multiplied signal to the subtractor 133.

The subtractor 133 determines a difference ϵ between the multiplied signal and a signal u, and outputs this difference ϵ to the coefficient update section 134.

The coefficient update section 134 updates the distortion compensation coefficient related to the address written to the training table C, for example, by using the LMS algorithm, in such a way that the difference ϵ is minimized.

The frequency counter 135 counts the number of each address in the training table C within a fixed period, which the address generator 131 has generated. In other words, the frequency counter 135 counts the occurrence frequency of each address in the training table C within the fixed period. Then, the frequency counter 135 outputs the counted occurrence frequencies to the conversion computing section 136.

The distortion compensation device 100-3 performs the above process every time a transmission signal x is received.

At fixed intervals, or every time the training table C is updated preset multiple times, the conversion computing section 136 performs calculation of converting the content of the training table C into that of the distortion compensation table C, based on the occurrence frequency of the addresses, as will be described below.

(Processing Operation of Distortion Compensation Device)

Figure 8:
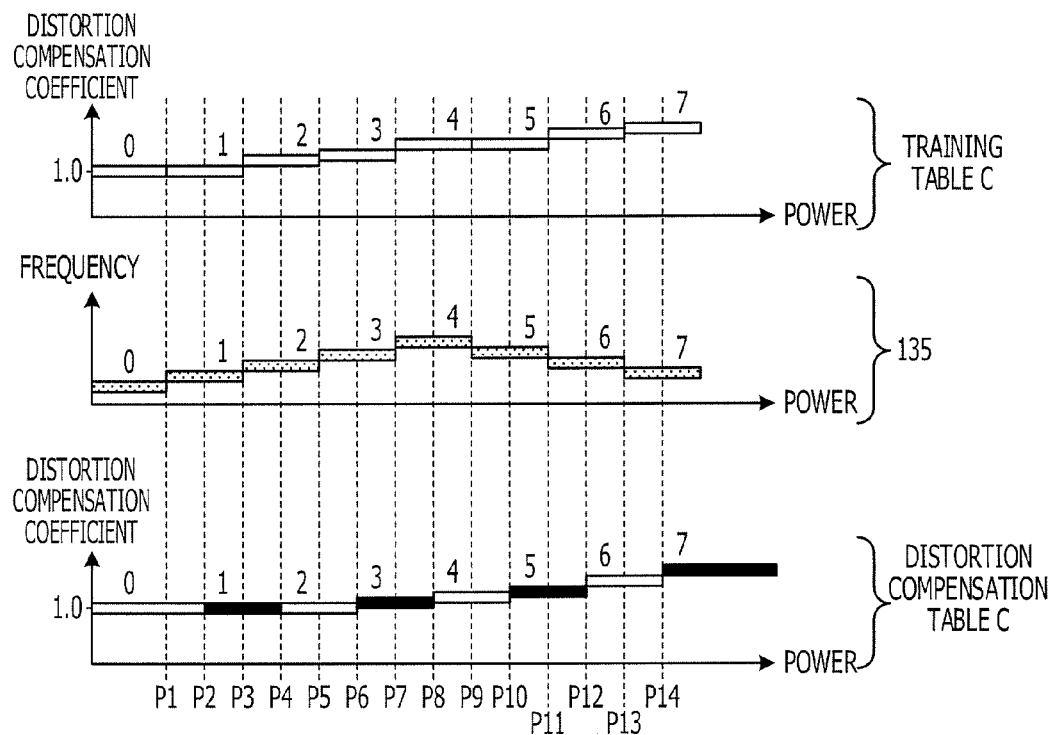
FIG. 8 illustrates a processing operation of the distortion compensation device in the third embodiment.

FIG. 8 illustrates a processing operation of the distortion compensation device in the third embodiment.

In the training table C, addresses 0, 1, 2 and 3 cover power ranges: of lower than P1; from P1 to lower than P3; from P3 to lower than P5; and from P5 to lower than P7, respectively, as illustrated in FIG. 8. In addition, addresses 4, 5, 6 and 7 cover power ranges: from P7 to lower than P9; from P9 to lower than P11; from P11 to lower than P13; and of P13 or larger, respectively. The address generator 131 thus generates the addresses 0, 1, 2 and 3 when the power of the signal y falls within the power ranges: of lower than P1; from P1 to lower than P3; from P3 to lower than P5; and from P5 to lower than P7, respectively. The address generator 131 also generates the addresses 4, 5, 6 and 7 when the power of the signal y falls within the power ranges: of from P7 to lower than P9; from P9 to lower than P11; from P11 to lower than P13, and of P13 or larger, respectively.

The frequency counter 135 counts the occurrence frequency of each address in the training table C.

The conversion computing section 136 performs the calculation of converting the content of the training table C into that of the distortion compensation table C, through the following equation (1), $$h'(a) = \frac{h(a) \times N(a) + h(a+1) \times N(a+1)}{N(a) + N(a+1)} \quad (1)$$

where: h'(a) denotes a converted distortion compensation coefficient, which is related to an address a in the distortion compensation table C; h(a) denotes a distortion compensation coefficient related to the address a in the training table C; h(a+1) denotes a distortion compensation coefficient related to an address a+1, or the next address from the address a, in the training table C; N(a) denotes the occurrence frequency of the address a; and N(a+1) denotes the occurrence frequency of the address a+1.

In FIG. 8, for example, the conversion computing section 136 determines a distortion compensation coefficient h'(1) related to an address 1 (covering the power ranges of P2 to P4) in the distortion compensation table C, through the following equation (2), $$h'(1) = \frac{h(1) \times N(1) + h(2) \times N(2)}{N(1) + N(2)} \quad (2)$$

Likewise, the conversion computing section 136 also determines h'(2) to h'(7) in the distortion compensation table C, based on the distortion compensation coefficients in the training table C and the occurrence frequency of each address in the training table C. Thus, the conversion computing section 136 determines the weighted mean of respective distortion compensation coefficients related to a certain address in the training table C and its adjacent address therein by using their occurrence frequencies. Then, the conversion computing section 136 sets the determined weighted mean, as a distortion compensation coefficient related to the certain address in the distortion compensation table C.

The distortion compensation device 100-3 in this embodiment compensates for distortions by using distortion compensation coefficients, each of which undergoes the weighted mean process using the occurrence frequencies of an adjacent pair of addresses. In the training table C, the occurrence frequency of each address corresponds to that of a distortion compensation coefficient related to each address. For this reason, more precise distortion compensation coefficients tend to be weighted more heavily in the weighted mean process. Between each adjacent pair of addresses, a more precise distortion compensation coefficient is weighted more heavily in the weighted mean process. Consequently, according to the third embodiment, the distortion compensation property is maintained appropriately.

[Fourth Embodiment]

A fourth embodiment differs from the first embodiment in creating distortion compensation tables by employing a direct-learning scheme.

(Exemplary Configuration of Distortion Compensation Device)

Figure 9:
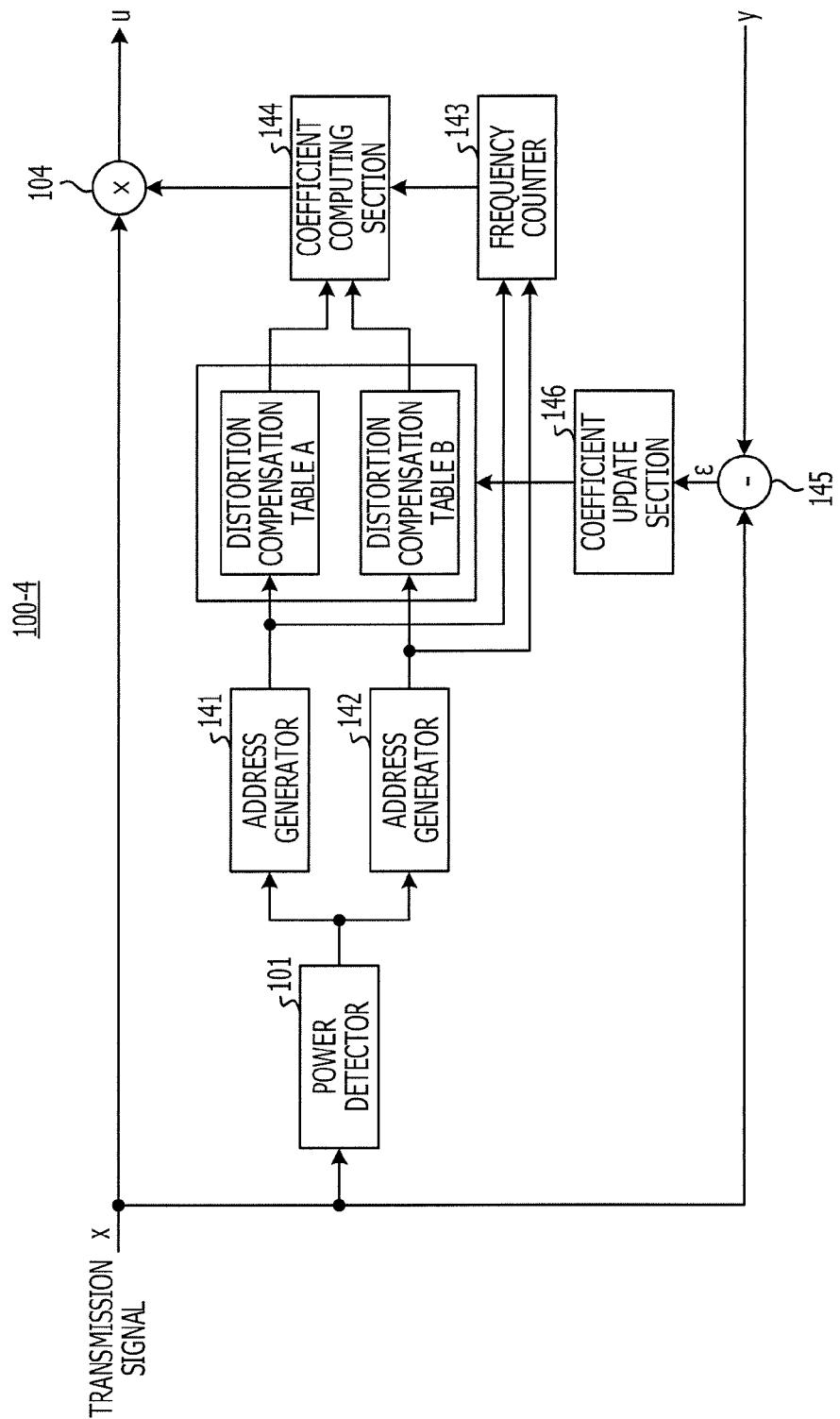
FIG. 9 is a block diagram illustrating an exemplary configuration of a distortion compensation device in a fourth embodiment.

FIG. 9 is a functional block diagram illustrating an exemplary configuration of a distortion compensation device in the fourth embodiment. The distortion compensation device 100-4 in FIG. 9 corresponds to the distortion compensation device 100 in FIG. 1. Referring to FIG. 9, the distortion compensation device 100-4 has address generators 141 and 142, distortion compensation tables A and B, a frequency counter 143, a coefficient computing section 144, a subtractor 145, and a coefficient update section 146.

The address generator 141 generates an address in accordance with the power detected by the power detector 101. The address generator 141 then passes the generated address to the distortion compensation table A, reads a distortion compensation coefficient related to this address from the distortion compensation table A, and outputs this distortion compensation coefficient to the coefficient computing section 144. The address passed to the distortion compensation table A becomes an address read from or written to the distortion compensation table A. The address generator 142 in turn generates an address in accordance with the power detected by the power detector 101. The address generator 142 then passes the generated address to the distortion compensation table B, reads a distortion compensation coefficient related to this address from the distortion compensation table B, and outputs this distortion compensation coefficient to the coefficient computing section 144. The address passed to the distortion compensation table B becomes an address read from or written to the distortion compensation table B. Both the address generators 141 and 142 also output the generated addresses to the frequency counter 143. In this case, both the address generator 141 and the address generator 142 generate different addresses in relation to the same power. Details of the method of generating addresses will be described below.

The distortion compensation tables A and B in this embodiment are the same as those in the first embodiment, respectively.

The frequency counter 143 counts the number of each address in the distortion compensation table A within a fixed period, which the address generator 141 has generated. Likewise, the frequency counter 143 counts the number of each address in the distortion compensation table B within the fixed period, which the address generator 142 has generated. In other words, the frequency counter 143 counts the occurrence frequency of each address in the distortion compensation tables A and B within the fixed period. Then, the frequency counter 143 outputs the counted occurrence frequencies to the coefficient computing section 144.

The coefficient computing section 144 determines a distortion compensation coefficient by which the transmission signal x is to be multiplied, based on the occurrence frequencies of the addresses and the distortion compensation coefficients in the distortion compensation tables A and B. Then, the coefficient computing section 144 outputs this distortion compensation coefficient to the multiplier 104. Details of the computing method performed by the coefficient computing section 144 will be described below.

The subtractor 145 determines a difference ϵ between a signal y and the transmission signal x, and outputs this difference ϵ to the coefficient update section 146.

The coefficient update section 146 updates the respective distortion compensation coefficients related to the addresses written to the distortion compensation tables A and B, for example, by using the LMS algorithm, in such a way that the difference ϵ is minimized.

The distortion compensation device 100-4 performs the above process every time a transmission signal x is received.

(Processing Operation of Distortion Compensation Device)

Figure 10:
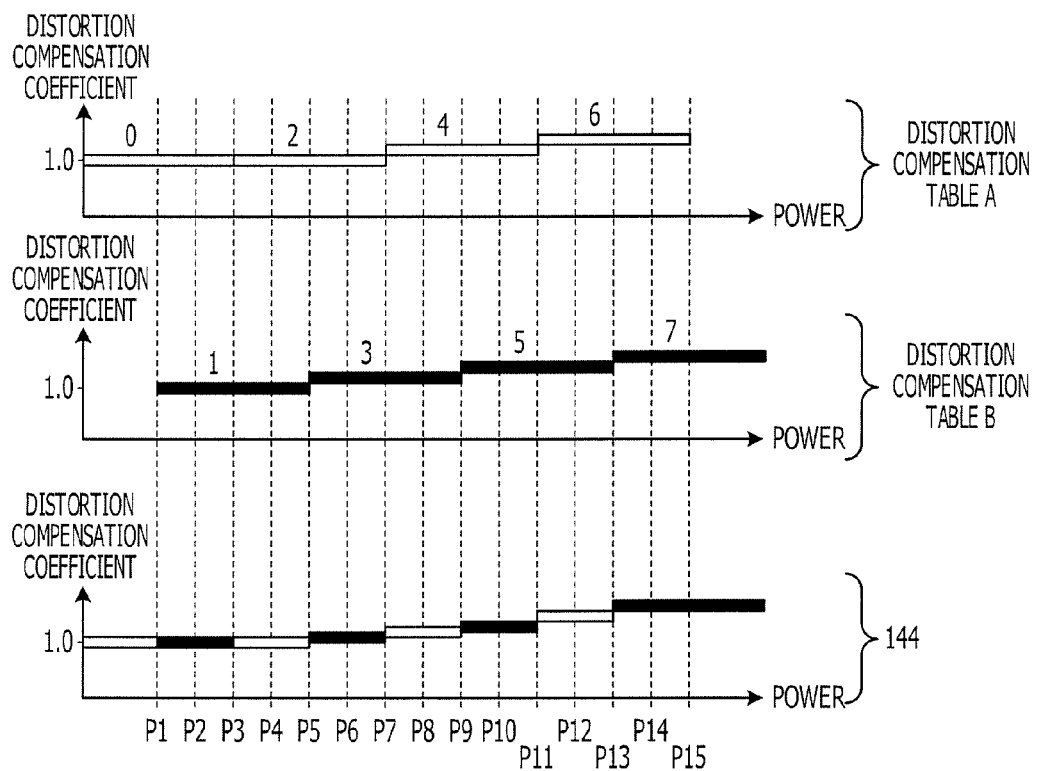
FIG. 10 illustrates a processing operation of the distortion compensation device in the fourth embodiment.

FIG. 10 illustrates a processing operation of the distortion compensation device in the fourth embodiment.

In the training table A, addresses 0, 2, 4 and 6 cover power ranges: of lower than P3; from P3 to lower than P7; from P7 to lower than P11; and from P11 to lower than P15, respectively, as illustrated in FIG. 10. The address generator 141 thus generates the addresses 0, 2, 4 and 6 when the power of the signal x falls within the power ranges: of lower than P3; from P3 to lower than P7; from P7 to lower than P11; and from P11 to lower than P15, respectively.

In the training table B, addresses 1, 3, 5 and 7 cover power ranges: from P1 to lower than P5; from P5 to lower than P9; from P9 to lower than P13; and of P13 or larger, respectively. The address generator 142 thus generates addresses 1, 3, 5 and 7 when the power of the signal x falls within the power ranges: from P1 to lower than P5; from P5 to lower than P9; from P9 to lower than P13; and of P13 or larger, respectively.

The power range of P1 to P5 that the address 1 in the training table B covers overlaps both the power range of P1 to P3, which is part of a power range that the address 0 in the training table A covers and the power range of P3 to P5, which is part of a power range that the address 2 in the training table A covers. Likewise, the power range of P5 to P9 that the address 3 in the training table B covers overlaps both the power range of P5 to P7, which is part of a power range that the address 2 in the training table A covers, and the power range of P7 to P9, which is part of a power range that the address 4 in the training table A covers. This also applies to the addresses 4 to 7. Thus, the addresses assigned to the training table A differ from the addresses assigned to the training table B, and a power range that one of the addresses in the table A covers overlaps a power range that at least one of the addresses in the table B covers.

To give an example, when the power of the transmission signal x falls within the range of P1 to P3, the coefficient update section 146 updates respective distortion compensation coefficients related to the address 0 in the distortion compensation table A and the address 1 in the distortion compensation table B, simultaneously. To give another example, when the power of the transmission signal x falls within the range of P13 to P15, the coefficient update section 146 updates respective distortion compensation coefficients related to the address 6 in the distortion compensation table A and the address 7 in the distortion compensation table B, simultaneously. Therefore, since a power range that one of the addresses in the table A covers overlaps a power range that at least one of the addresses in the table B covers, distortion compensation coefficients in both the tables A and B are updated at an increased frequency. In this manner, the distortion compensation device 100-4 updates distortion compensation coefficients in both the training tables A and B simultaneously, in relation to the power of the single signal x. According to this embodiment, the distortion compensation device 100-4 is capable of converging distortion compensation coefficients at an early stage by updating them at an increased frequency.

The coefficient computing section 144 determine a distortion compensation coefficient h, by which the transmission signal x is to be multiplied, through the following equation (3), $$h = \frac{h_A(a) \times N_A(a) + h_B(a-1) \times N_B(a-1)}{N_A(a) + N_B(a-1)} \quad (3)$$

where: h denotes a distortion compensation coefficient determined by the coefficient computing section 144; $h_A(a)$ denotes a distortion compensation coefficient related to an address a in the distortion compensation table A; $h_B(a-1)$ denotes a distortion compensation coefficient related to an address a−1 of addresses in the distortion compensation table B, or the distortion compensation coefficient preceding the address a; $N_A(a)$ denotes the occurrence frequency of the address a in the distortion compensation table A; and $N_B(a-1)$ denotes the occurrence frequency of the address a−1 in the distortion compensation table B.

In FIG. 10, for example, the coefficient computing section 144 determines a distortion compensation coefficient h related to the power range of P3 to P5, through the following equation (4), $$h = \frac{h_A(2) \times N_A(2) + h_B(1) \times N_B(1)}{N_A(2) + N_B(1)} \quad (4)$$

Likewise, the coefficient computing section 144 determines a distortion compensation coefficient h related to another power range by which a transmission signal is to be multiplied, based on distortion compensation coefficients in the distortion compensation tables A and B and the occurrence frequencies of addresses in the distortion compensation tables A and B. Thus, the coefficient computing section 144 refers to the respective occurrence frequencies of addresses in the distortion compensation tables A and B, the addresses related to the same power and covering respective power ranges overlapping each other. Then, the coefficient computing section 144 determines the weighted mean of the respective distortion compensation coefficients related to the addresses, based on their occurrence frequencies. Finally, the coefficient computing section 144 sets the result as a final distortion compensation coefficient.

In this embodiment, as described above, the distortion compensation device 100-4 compensates for distortions by using a distortion compensation coefficient obtained by subjecting the weighted mean process to respective addresses in distortion compensation tables A and B with their occurrence frequencies, both addresses covering respective power ranges overlapping each other. The occurrence frequency of each address corresponds to that of a distortion compensation coefficient related to each address. Therefore, more precise distortion compensation coefficients tend to be weighted more heavily in the weighted mean process. Thus, as a distortion compensation coefficient related to overlapping addresses becomes more precise, the distortion compensation device 100-4 weights the distortion compensation coefficient more heavily in the weighted mean process. In this embodiment, between each adjacent pair of addresses, the power range of which overlap each other, a more precise distortion compensation coefficient is weighted more heavily in the weighted mean process. Consequently, according to this embodiment, the distortion compensation property is maintained appropriately.

According to the fourth embodiment, it is possible for the distortion compensation device 100-4 to compensate for distortions appropriately and to converge distortion compensation coefficients at an early stage.

[Other Fourth Embodiments]

[1] In the foregoing embodiments, an address is generated in accordance with the power of a signal; however, the distortion compensation device 100 may detect the amplitude of a signal and generate an address in accordance with the detected amplitude. In the case where an address is generated in accordance with the amplitude of a signal, "power" may be replaced by "amplitude" in the foregoing embodiments.

Figure 11:
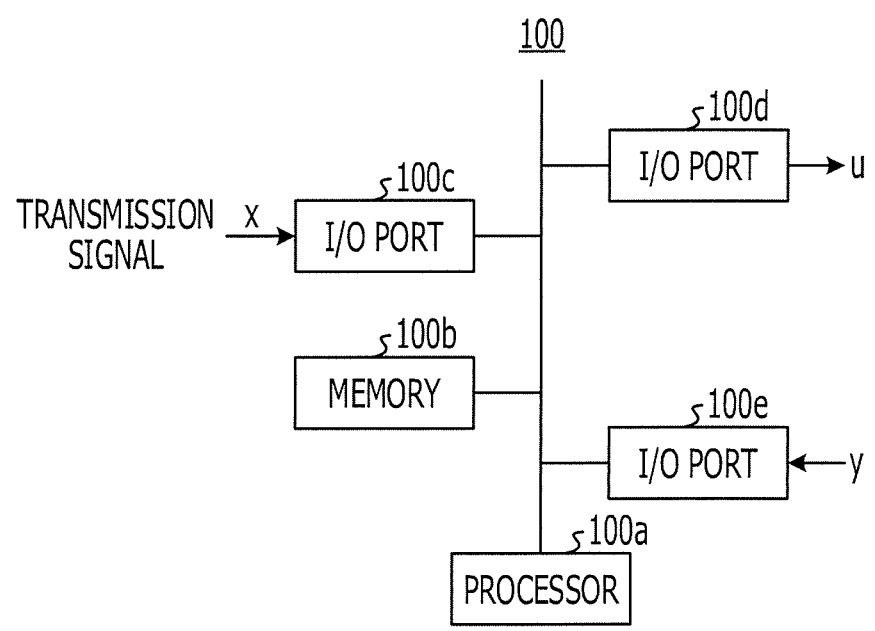
FIG. 11 illustrates an exemplary hardware configuration of the distortion compensation device in another embodiment.

[2] The distortion compensation device 100 described above may be implemented using the following hardware configuration. FIG. 11 illustrates an exemplary hardware configuration of the distortion compensation device in this embodiment. Referring to FIG. 11, a distortion compensation device 100 has a processor 100a, a memory 100b, and I/O ports 100c, 100d and 100e as hardware constitute elements. The distortion compensation device 100 corresponds to one of the distortion compensation devices 100-1, 100-2, 100-3 and 100-4 described above. Examples of the processor 100a include a central processing unit (CPU), a digital signal processor (DSP), and a field programmable gate array (FPGA). The distortion compensation device 100 may also have a large scale integrated circuit (LSI) including the processor 100a and its peripheral circuit. Examples of the memory 100b include a random access memory (RAM), a synchronous dynamic random access memory (SDRAM), a read only memory (ROM), and a flash memory. The processor 100a may implement power detectors 101 and 111, address generators 102, 112, 115, 131, 141 and 142, a selector 103, multipliers 104, 113, 116 and 132, subtractors 114, 117, 133 and 145. Moreover, the processor 100a may implement coefficient update sections 118, 134 and 146, a copy section 119, a weighting section 121, frequency counters 135 and 143, a conversion computing section 136, and a coefficient computing section 144. The memory 100b may implement distortion compensation tables A, B and C and training tables A, B and C. The distortion compensation device 100 may receive a transmission signal x and signal y through the I/O ports 100c and 100e, respectively, and output a signal u through the I/O port 100d.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation device comprising:
a memory configured to store a first table and a second table, different addresses being assigned to the first table and the second table respectively, each of the addresses being related to a different, respective distortion compensation coefficient to compensate for a non-linear distortion, a first address in the first table and a second address in the second table corresponding to respective first and second ranges of power or amplitude of a transmission signal, and parts of the first and second ranges overlapping each other; and
a processor coupled to the memory and configured to:
update the respective distortion compensation coefficients related to the first address and the second address simultaneously, in accordance with a single value of the power or the amplitude, and
compensate for the non-linear distortion generated by an amplifier amplifying the power of the transmission signal, by using at least one of the first table and the second table.

2. The distortion compensation device according to claim 1, wherein the processor is configured to:
generate an address in accordance with the power or the amplitude of the transmission signal,
select one of the first table and the second table depending on the generated address, and
compensate for the non-linear distortion by using the selected table.

3. The distortion compensation device according to claim 2, wherein the processor is configured to apply weighting to the updating, in accordance with power or amplitude of a feedback signal from the amplifier.

4. The distortion compensation device according to claim 1, wherein the processor is configured to:
generate the first address and the second address in accordance with the power or the amplitude of the transmission signal,
count a first occurrence frequency of the first address and a second occurrence frequency of the second address, and
determine a distortion compensation coefficient used to compensate for the non-linear distortion, based on the respective distortion compensation coefficients related to the first address and the second address, the first occurrence frequency, and the second occurrence frequency.

5. A distortion compensation method comprising:
updating, by a processor, respective distortion compensation coefficients related to a first address in a first table and a second address in a second table simultaneously, in accordance with a single value of power or amplitude of a transmission signal, different addresses being assigned to the first table and the second table respectively, each of the addresses being related to a different, respective distortion compensation coefficient to compensate for a non-linear distortion, the first address and the second address corresponding to respective first and second ranges of the power or the amplitude, and parts of the first and second ranges overlapping each other; and
compensating the non-linear distortion generated by an amplifier amplifying the power of the transmission signal, by using at least one of the first table and the second table.

6. The distortion compensation method according to claim 5, further comprising:
generating an address in accordance with the power or the amplitude of the transmission signal; and
selecting one of the first table and the second table depending on the generated address, wherein the compensating includes compensating for the non-linear distortion by using the selected table.

7. The distortion compensation method according to claim 6, further comprising:
applying weighting to the updating, in accordance with power or amplitude of a feedback signal from the amplifier.

8. The distortion compensation method according to claim 5, further comprising:
generating the first address and the second address in accordance with the power or the amplitude of the transmission signal;
counting a first occurrence frequency of the first address and a second occurrence frequency of the second address; and
determining a distortion compensation coefficient used to compensate for the non-linear distortion, based on the respective distortion compensation coefficients related to the first address and the second address, the first occurrence frequency, and the second occurrence frequency.

* * * * *